United States Patent
Lee

(10) Patent No.: US 6,735,136 B2
(45) Date of Patent: May 11, 2004

(54) SEMICONDUCTOR MEMORY DEVICE CAPABLE OF PREVENTING COUPLING NOISE BETWEEN ADJACENT BIT LINES IN DIFFERENT COLUMNS

(75) Inventor: Jae-Goo Lee, Sungnam-shi (KR)

(73) Assignee: Samsung Electronics Co., Ltd. (KR)

( * ) Notice: Subject to any disclaimer, the term of this patent is extended or adjusted under 35 U.S.C. 154(b) by 1 day.

(21) Appl. No.: 10/299,407

(22) Filed: Nov. 19, 2002

(65) Prior Publication Data

US 2003/0117874 A1 Jun. 26, 2003

(30) Foreign Application Priority Data

Nov. 19, 2001 (KR) .................................... 2001-71800

(51) Int. Cl.[7] ............................................... G11C 7/02
(52) U.S. Cl. .............. 365/206; 365/230.04; 365/230.06
(58) Field of Search ................................ 365/206, 207, 365/230.03, 230.04, 230.06, 189.01

(56) References Cited

U.S. PATENT DOCUMENTS

| | | | | |
|---|---|---|---|---|
| 5,029,134 A | * | 7/1991 | Watanabe | ............... 365/189.05 |
| 5,276,649 A | * | 1/1994 | Hoshita et al. | ............... 365/206 |
| 5,610,871 A | * | 3/1997 | Hidaka | ................... 365/230.03 |
| 5,973,983 A | * | 10/1999 | Hidaka | ................... 365/230.03 |
| 6,259,642 B1 | * | 7/2001 | Hwang et al. | ............... 365/206 |

* cited by examiner

Primary Examiner—Gene Auduong
(74) Attorney, Agent, or Firm—F Chau & Associates, LLC

(57) ABSTRACT

A semiconductor memory device capable of preventing coupling noise being generated between adjacent bit lines in different columns. The device comprises first and second columns, wherein each column comprises a pair of bit lines, and wherein the first and second columns are adjacent, first and second sense amplifiers, each being connected to the bit lines of the first or second column, for sensing and amplifying a voltage difference between the bit lines of the first or second column, and a control circuit for controlling the first and second sense amplifiers. When the voltages of adjacent bit lines of the first and second columns transition in an opposite direction during a read operation, the control circuit controls the first and second sense amplifiers to concurrently amplify the voltages of the adjacent bit lines.

19 Claims, 8 Drawing Sheets

SEMICONDUCTOR MEMORY DEVICE CAPABLE OF PREVENTING COUPLING NOISE BETWEEN ADJACENT BIT LINES IN DIFFERENT COLUMNS

CROSS-REFERENCE TO RELATED APPLICATION

This application claims priority to Korean Patent Application No. 2001-71800, filed on Nov. 19, 2001.

BACKGROUND

1. Technical Field

The present invention relates to semiconductor memory devices and, in particular, to a semiconductor memory device comprising a shared sense amplifier structure, which prevents coupling noise between adjacent bit lines in different columns.

2. Description of Related Art

FIG. 1 is a block diagram of a semiconductor memory device. A semiconductor memory device 10 comprises a memory block 12 having a plurality of columns. Each column comprises a pair of bit lines and a plurality of memory cells such as DRAM, SRAM, or EEPROM cells.

For example, first through fourth columns each comprise a pair of bit lines DB0 and DBb0, UB0 and UBb0, DB1 and DBb1, and UB1 and UBb1, respectively. Odd-numbered and even-numbered columns are alternatively arranged in the memory block 12. Eight pairs of bit lines are shown in FIG. 1 for purposes of illustration, and it is to be understood that the memory can comprise additional pairs of bit lines arranged therein.

Each of the bit line pairs DB0/DBb0, DB1/DBb1, DB2/DBb2, and DB3/DBb3, of the odd-numbered columns (first, third, fifth and seventh columns) is connected to a corresponding bit line precharging and equalizing circuit 14, bit line isolating circuit 16, and sense amplifier 18.

For example, the bit line precharging and equalizing circuit 14 for bit line pair DB0/DBb1 comprises three NMOS transistors M1, M2, and M3. The bit line precharging and equalizing circuit 14 precharges and equalizes the bit lines to a predetermined voltage (e.g., ½ VCC voltage) in response to a control signal PEQi. Each bit line isolating circuit 16 is connected to a corresponding bit line pair to selectively connect the bit lines to a corresponding sense amplifier 18. Each bit line isolating circuit 16 comprises NMOS transistors M4 and M5 that are simultaneously activated/deactivated in response to a control signal PISOi.

Each sense amplifier 18 comprises a latch-type sense amplifier and is connected to a corresponding bit line pair and to voltage lines LA and LAb. The voltage line LAb is connected to ground voltage through an NMOS transistor M10, which is activated in response to a control signal LANG output from a control block 20. The voltage line LA is connected to power supply voltage for array Varray through a PMOS transistor M11, which is activated in response to a control signal LAPG output from the control block 20. The control block 20 generates the control signals LANG and LAPG in response to a complementary sense enable signal $\overline{BLSA\_en}$.

Further, each bit line pair UB0/UBb0, UB1/UBb1, UB2/UBb2, and UB3/UBb3 (which correspond to even-numbered columns) are connected to a corresponding bit line precharging and equalizing circuit 22, a bit line isolating circuit 24, and a sense amplifier 26. The circuits 22, 24 and 26 have the same configurations as circuits 14, 16 and 18.

FIG. 2 is a circuit diagram of the control block 20 of FIG. 1. FIG. 3 depicts exemplary waveforms of the control signals of FIG. 2. The control block 20 comprises an inverter INV1, a delay element 21, and a NAND gate G1, and generates control signals LANG and LAPG in response to the sense enable signal $\overline{BLSA\_en}$. When the sense enable signal $\overline{BLSA\_en}$ transitions from a high level to a low level, the control signal LANG is activated at a high level as illustrated in FIG. 3. In response to the activation of the control signal LANG, the NMOS transistor M10 (FIG. 1) is activated, thereby supplying ground voltage to the voltage line LAb. The control signal LANG is delayed by delay element 21. The delayed control signal and the control signal LANG are NAND gated by gate G1 to generate the control signal LAPG. When the control signal LAPG transitions from a high level to a low level, the PMOS transistor M11 (shown in FIG. 1) is activated, thereby supplying power supply voltage for array Varray to the voltage line LA.

In the semiconductor memory device 10, coupling noise is generated between adjacent bit lines in adjacent columns, as indicated by the dotted circles that connect adjacent bit lines in FIG. 1. The bit line pair of each column, which comprises a true bit line and a complement bit line, receives data from a memory cell in response to the activation of a row or a word line connected to the memory cell.

FIG. 4A is an exemplary diagram illustrating coupling noise that is generated in the semiconductor memory device 10. For example, when the memory cell storing data '1' is sensed, a precharge voltage of the true bit line UB0 of the second column connected to the memory cell is increased by the voltage corresponding to the data '1'. The complement bit line UBb0 of the true bit line UB0 maintains the precharged voltage. When the control signal LANG is activated, a voltage of a bit line having a relatively lower voltage, that is, the voltage of the complement bit line UBb0, is lowered to ground voltage. When the control signal LAPG is activated, a voltage of a bit line having a relatively higher voltage, that is, the voltage of the true bit line UB0 is increased to the power supply voltage for array Varray.

When a memory cell connected to a true bit line (e.g., the true bit line DB1 of the third column) of an adjacent column to the second column stores data '1', the precharged voltage of the true bit line DB1 is increased by the voltage corresponding to the data '1'. The corresponding complement bit line DBb1 maintains the precharged voltage. When the control signal LANG is activated, a voltage of a bit line having a relatively lower voltage, that is, the voltage of the complement bit line DBb1, is lowered to the ground voltage. When the control signal LAPG is activated, a voltage of a bit line having a relatively higher voltage, that is, the voltage of the true bit line DB1 is increased to the power supply voltage for array Varray.

A coupling capacitor is formed between the adjacent bit lines UBb0 and DB1 of the adjacent pairs of bit lines UB0 and UBb0, and DB1 and DBb1 of the second and third columns. When the voltage of the complement bit line UBb0 of the second column is lowered to the ground voltage in response to the activation of the control signal LANG, the voltage of the true bit line DB1 of the third column is instantly lowered by the coupling capacitor, as illustrated in FIG. 4A. This phenomenon is called "coupling noise", which generates erroneous data.

The coupling noise also occurs when a memory cell storing data '0' is sensed. Referring to FIG. 4B, when the memory cell storing data '0' is sensed, the true bit line UB3 of the eighth column connected to the memory cell stores the data '0'. The precharged voltage of the true bit line UB3 is lowered by the voltage corresponding to the data '0', while the corresponding complement bit line UBb3 maintains the precharged voltage. In response to the activation of the control signal LANG, a voltage of a bit line having a relatively lower voltage, that is, the voltage of the true bit line UB3, is lowered to the ground voltage. In response to the activation of the control signal LAPG, a voltage of a bit line having a relatively higher voltage, that is, the voltage of the complement bit line UBb3, is increased to the power supply voltage for array Varray.

When the memory cell connected to a column (e.g., the seventh column) that is adjacent to the eighth column stores data '0', the precharged voltage of the true bit line DB3 of the seventh column is lowered by the voltage corresponding to the data '0'. The corresponding complement bit line DBb3 maintains the precharged voltage. In response to the activation of the control signal LANG, a voltage of a bit line having a relatively lower voltage, that is, the voltage of the true bit line DB3, is lowered to the ground voltage. In response to the activation of the control signal LAPG, a voltage of a bit line having a relatively higher voltage, that is, the voltage of the complement bit line DB3, is increased to the power supply voltage for array Varray.

When the voltage of the true bit line UB3 is lowered to the ground voltage in response to the activation of the control signal LANG, the voltage of the complement bit line DBb3 is instantly lowered through the coupling capacitor, as illustrated in FIG. 4B, thereby generating erroneous data.

Thus, a need exists for preventing the generation of the coupling noise between adjacent bit lines in different columns.

SUMMARY OF THE INVENTION

It is an object of the invention to provide a semiconductor memory device that prevents coupling noise from being generated between adjacent bit lines in different columns.

According to one aspect of the present invention, a semiconductor memory device comprises first and second columns, wherein each column comprises a pair of bit lines, and wherein the first and second columns are adjacent, a first sense amplifier, connected to the bit lines of the first column, for sensing and amplifying a voltage difference between the bit lines of the first column, a second sense amplifier, connected to the bit lines of the second column, for sensing and amplifying a voltage difference between the bit lines of the second column, and a control circuit for controlling the first and second sense amplifiers, wherein when voltage levels of adjacent bit lines of the first and second columns transition in an opposite direction during a read operation, the control circuit controls the first and second sense amplifiers to concurrently amplify the voltages of the adjacent bit lines.

In a preferred embodiment of the present invention, when the voltage levels of the adjacent bit lines of the first and second columns transition in the same direction during the read operation, the control circuit controls the first and second sense amplifiers to amplify the voltages of the adjacent bit lines at different times within a predetermined time interval.

According to another aspect of the present invention, a semiconductor memory device comprises an array of memory blocks each comprising a plurality of columns, each column comprising a pair of bit lines, a plurality of sense amplifier blocks, wherein first and second sense amplifier blocks are disposed on opposite sides of a corresponding memory block, wherein each sense amplifier block comprises a plurality of sense amplifiers connected to columns of the corresponding memory block, wherein adjacent columns are connected to sense amplifiers on opposite sides of the memory block, and a control circuit for controlling the first and second sense amplifier blocks, wherein when voltage levels of adjacent bit lines of adjacent columns of a memory block transition in an opposite direction during a read operation, the control circuit controls the first and second sense amplifier blocks to concurrently amplify the voltages of the adjacent bit lines.

In a preferred embodiment of the present invention, when the voltage levels of adjacent bit lines of adjacent columns transition in the same direction during the read operation, the control circuit controls the first and second sense amplifier blocks to amplify the voltages of the adjacent bit lines at different times within a predetermined time interval.

According to further aspect of the present invention, a method for preventing coupling noise from being generated in a semiconductor memory device, comprises sensing voltage differences between the bit lines in the first and second columns, respectively, and concurrently amplifying voltages of adjacent bit lines of the first and second columns, when the voltage levels of the adjacent bit lines of the first and second columns transition in an opposite direction during a read operation.

In a preferred embodiment of the present invention, the method further comprises amplifying the voltages of the adjacent bit lines of the first and second columns at different times within a predetermined time interval, when the voltage levels of the adjacent bit lines of the first and second columns transition in the same direction during the read operation.

These and other aspects, features, and advantages of the present invention will become apparent from the following detailed description of preferred embodiments, which is to be read in conjunction with the accompanying figures.

DESCRIPTION OF PREFERRED EMBODIMENTS

Figure 5:
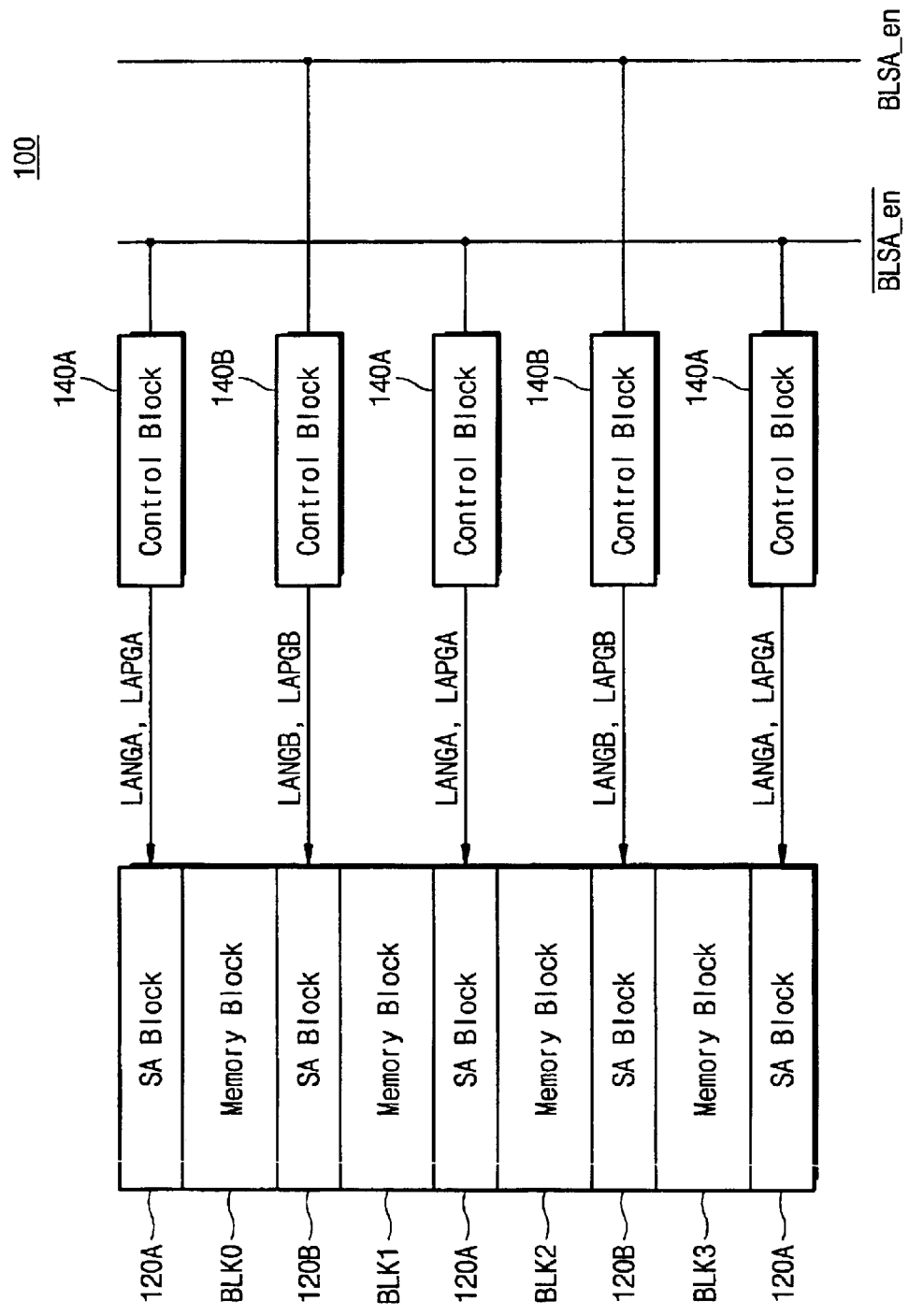
FIG. 5 is a block diagram of a semiconductor memory device according to an embodiment of the present invention.

FIG. 5 is a block diagram of a semiconductor memory device according to an embodiment of the present invention.

A semiconductor memory device 100 comprises a plurality of memory blocks BLK0, BLK1, BLK2, and BLK3, and a plurality of sense amplifier blocks 120A and 120B disposed on both sides (e.g., upper and lower parts) of the memory blocks BLK0, BLK1, BLK2, and BLK3. Although not shown in FIG. 5, each memory block comprises memory cells (e.g., DRAM cells) arranged in a matrix of rows and columns. Each column comprises true and complement bit lines.

One sense amplifier block 120A is disposed on an upper part of a memory block BLK0, and one sense amplifier block 120B is disposed on a lower part of the memory block BLK0. A memory block BLK1 is disposed on a lower part of the sense amplifier block 120B, and another sense amplifier block 120A is disposed on a lower part of the memory block BLK1. A memory block BLK2 is disposed on a lower part of the sense amplifier block 120A, and another sense amplifier block 120B is disposed on a lower part of the memory block BLK2. A memory block BLK3 is disposed on a lower part of the sense amplifier block 120B, and the other sense amplifier block 120A is disposed on a lower part of the memory block BLK3. This structure is referred to as "a shared sense amplifier structure" in which adjacent memory blocks share one of the sense amplifier blocks 120A and 120B. The sense amplifier blocks 120A and 120B are operated at different times within a predetermined time interval.

The semiconductor memory device 100 further comprises a plurality of control blocks 140A and 140B. Each of the control blocks 140A, which correspond to the sense amplifier blocks 120A, generates control signals LANGA and LAPGA for the sense amplifier block 120A in response to a complementary sense enable signal $\overline{BLSA\_en}$. Each of the control blocks 140B, which correspond to the sense amplifier blocks 120B, generates control signals LANGB and LAPGB for the sense amplifier block 120B in response to a sense enable signal $\overline{BLSA\_en}$.

In a preferred embodiment, each of the control signals LANGA and LANGB control the sense amplifier blocks 120A and 120B such that one of the bit lines of a column having a relatively lower voltage is connected to a voltage line of ground voltage. The control signals LANGA and LANGB are activated at different times. The control signals LAPGA and LAPGB control the sense amplifier blocks 120A and 120B such that one of the bit lines of a column having a relatively higher voltage is connected to a voltage line of power supply voltage. The control signals LAPGA and LAPGB are activated at different times within a predetermined time interval.

In a preferred embodiment, when the voltages of adjacent bit lines in different columns transition in an opposite direction, the voltages of the adjacent bit lines are amplified at the same time. Advantageously, the simultaneous amplification of the adjacent bit lines in different columns prevents the generation of coupling noise between the adjacent bit lines.

Figure 1:
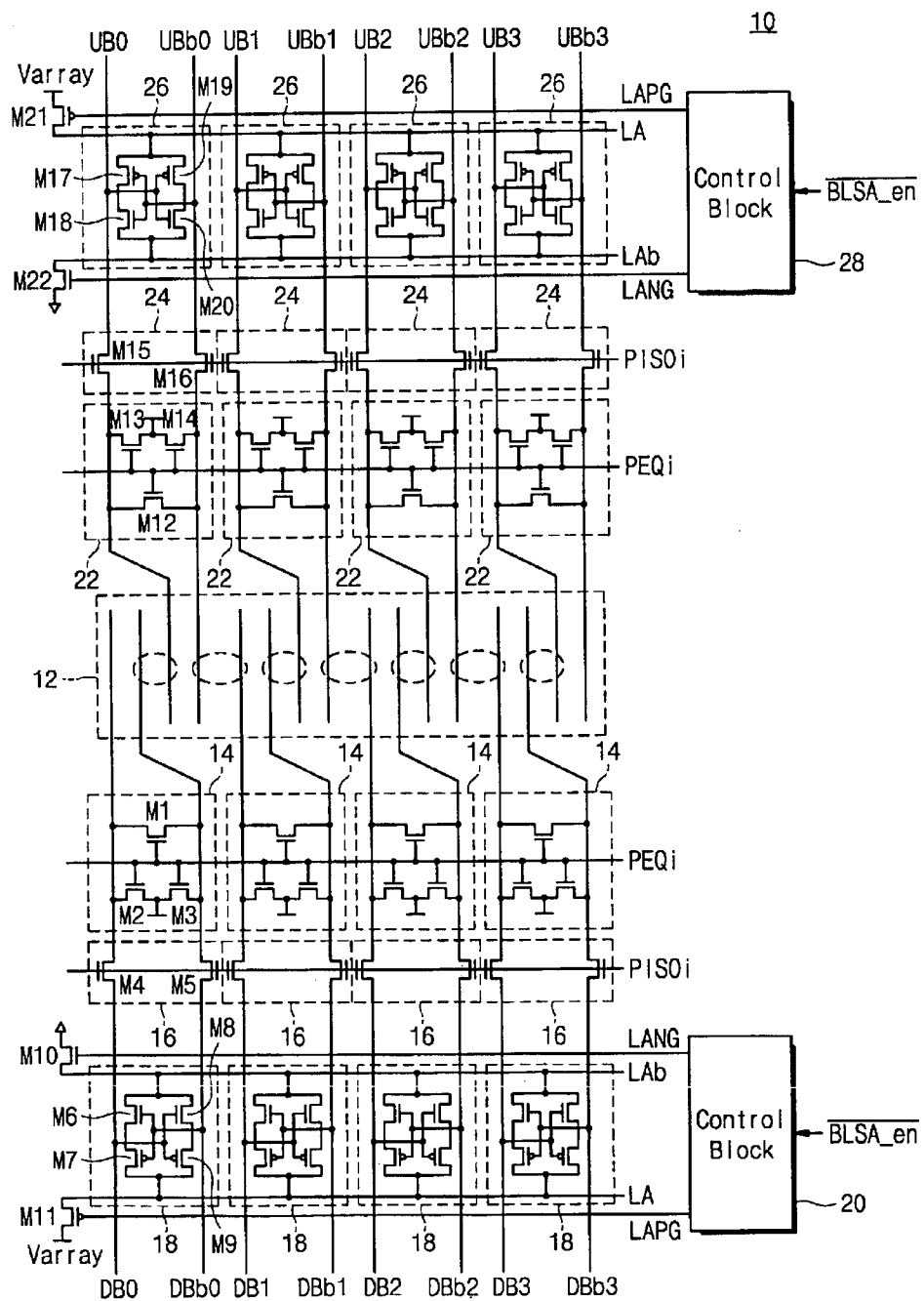
FIG. 1 is a block diagram of a semiconductor memory device.
Figure 2:
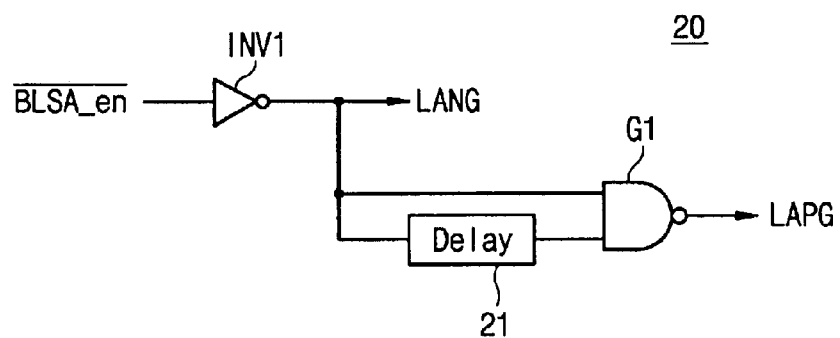
FIG. 2 is a circuit diagram of a control block of FIG. 1.
Figure 3:
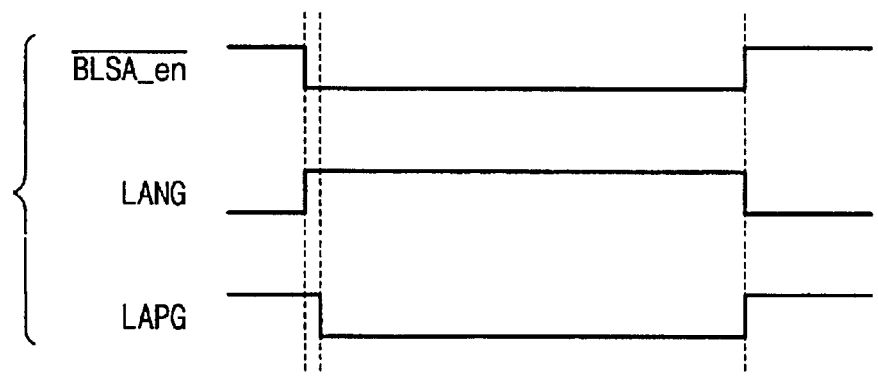
FIG. 3 is a diagram illustrating exemplary waveforms of control signals output from the control block of FIG. 2.
Figure 4A:
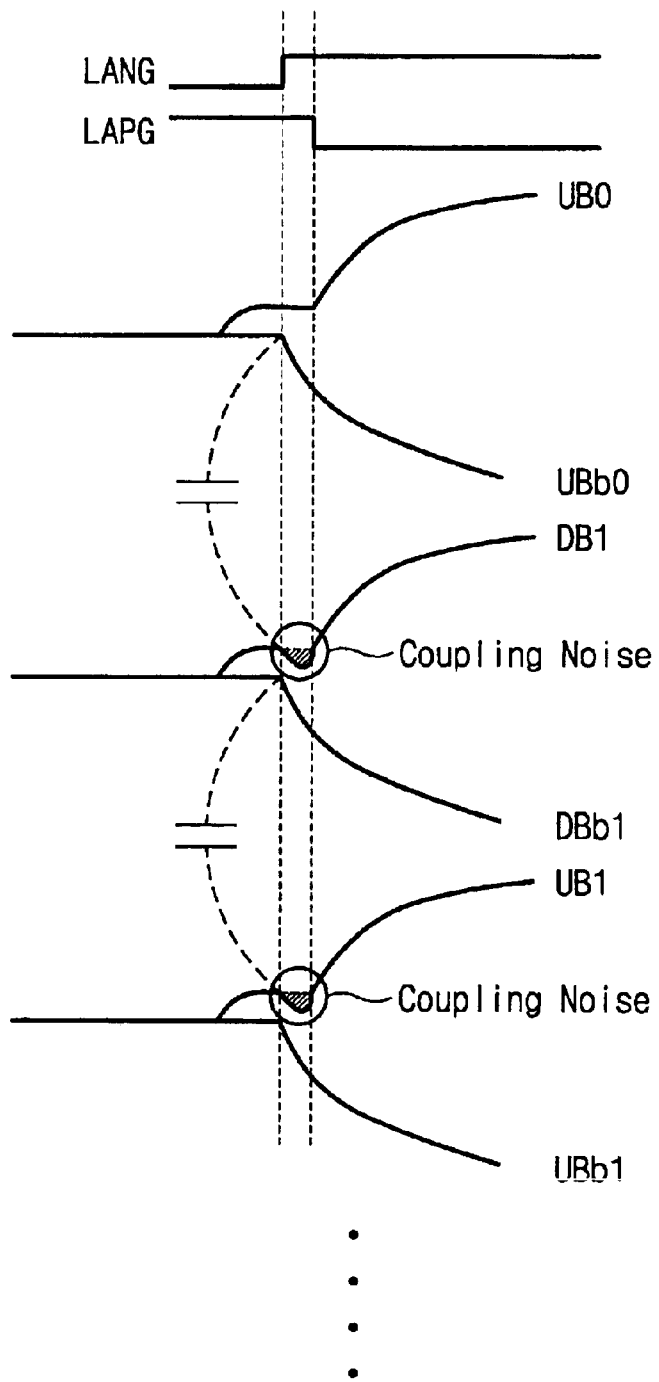
FIG. 4A is an exemplary diagram illustrating the generation of coupling noise in a semiconductor memory device.
Figure 4B:
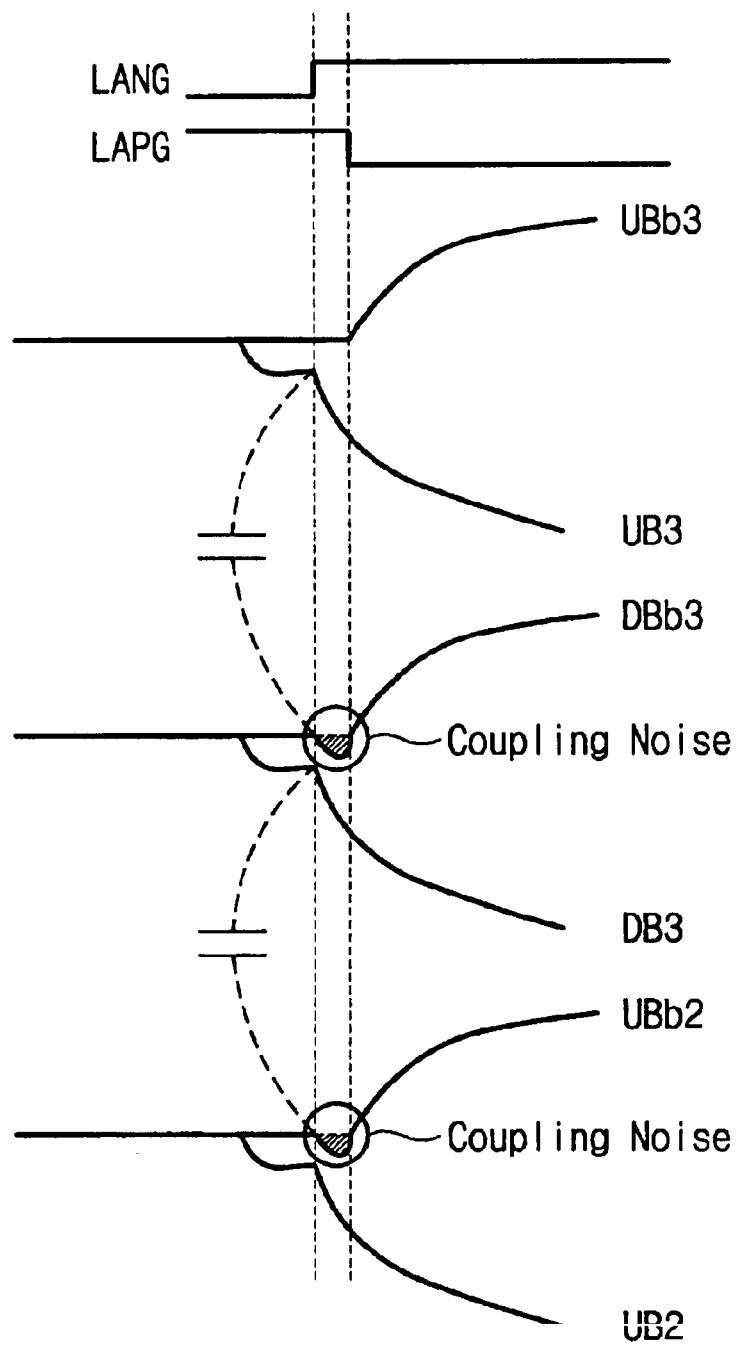
FIG. 4B is another exemplary diagram illustrating the generation of coupling noise in a semiconductor memory device.
Figure 6:
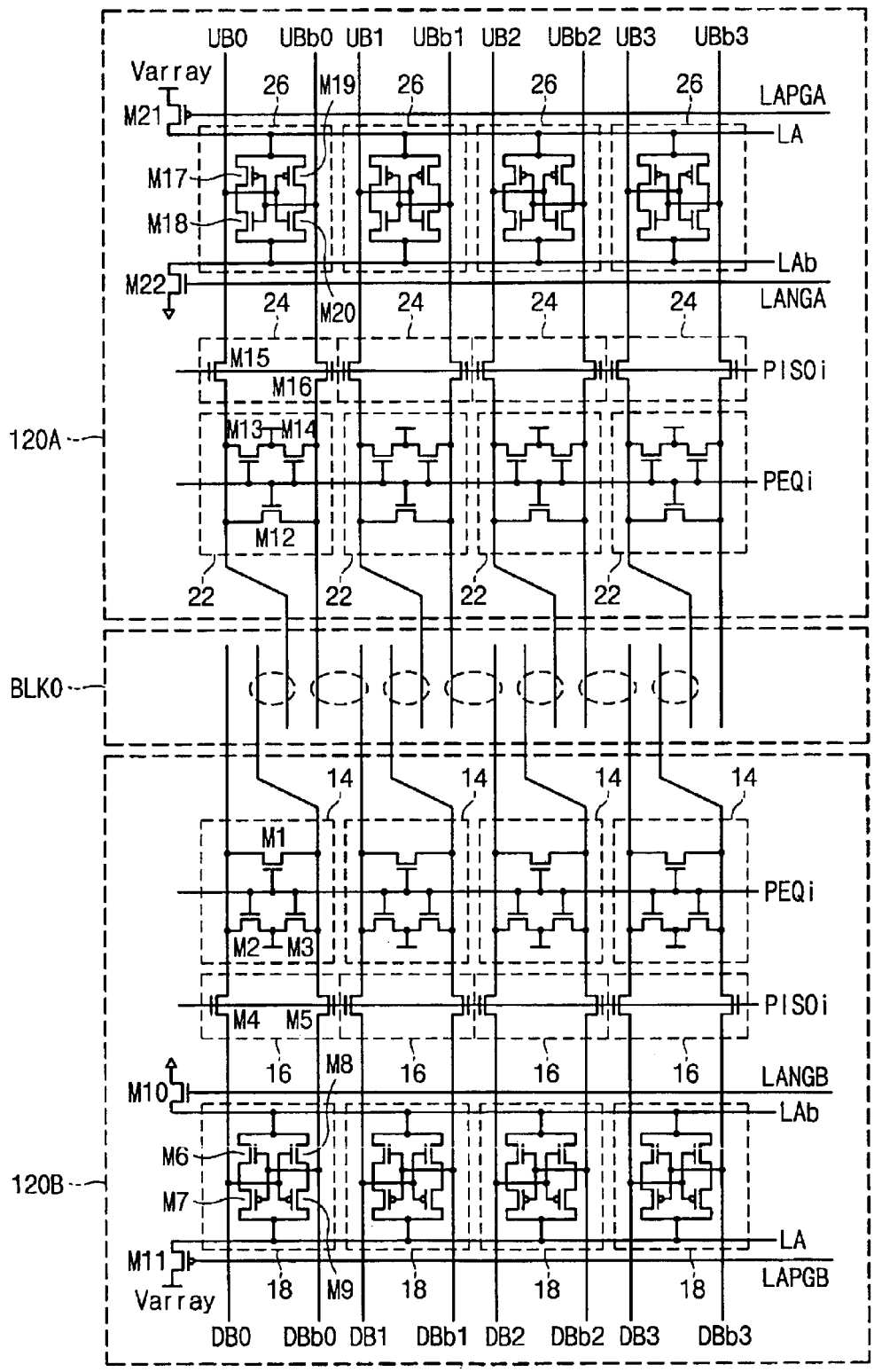
FIG. 6 is a circuit diagram illustrating a sense amplifier and control block of FIG. 5, according to an embodiment of the present invention.

FIG. 6 is a circuit diagram showing the sense amplifier blocks 120A and 120B disposed at the memory block BLK0. Even though FIG. 6 illustrates the memory block BLK0 having bit line pairs corresponding to eight columns, it is obvious that more bit line pairs may be arranged in the memory block BLK0. The sense amplifier block 120A is connected to bit line pairs (e.g., UB0 and UBb0, UB1 and UBb1, UB2 and UBb2, and UB3 and UBb3) of even-numbered columns. The sense amplifier block 120B is connected to bit line pairs (e.g., DB0 and DBb0, DB1 and DBb1, DB2 and DBb2, and DB3 and DBb3) of odd-numbered columns. In a preferred embodiment, the control signals LANGA and LAPGA for controlling the sense amplifiers 26 of the sense amplifier block 120A are electrically isolated from the control signals LANGB and LAPGB for controlling the sense amplifiers 18 of the sense amplifier block 120B. The sense amplifier blocks illustrated in FIG. 6 are the same of those depicted in FIG. 1.

Figure 7:
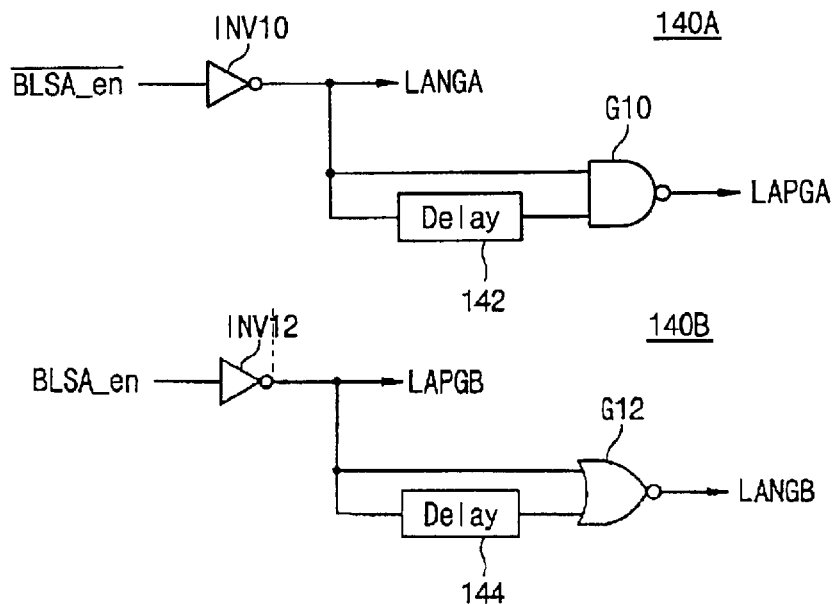
FIG. 7 is a circuit diagram illustrating a control block of FIG. 6, according to an embodiment of the present invention.
Figure 8:
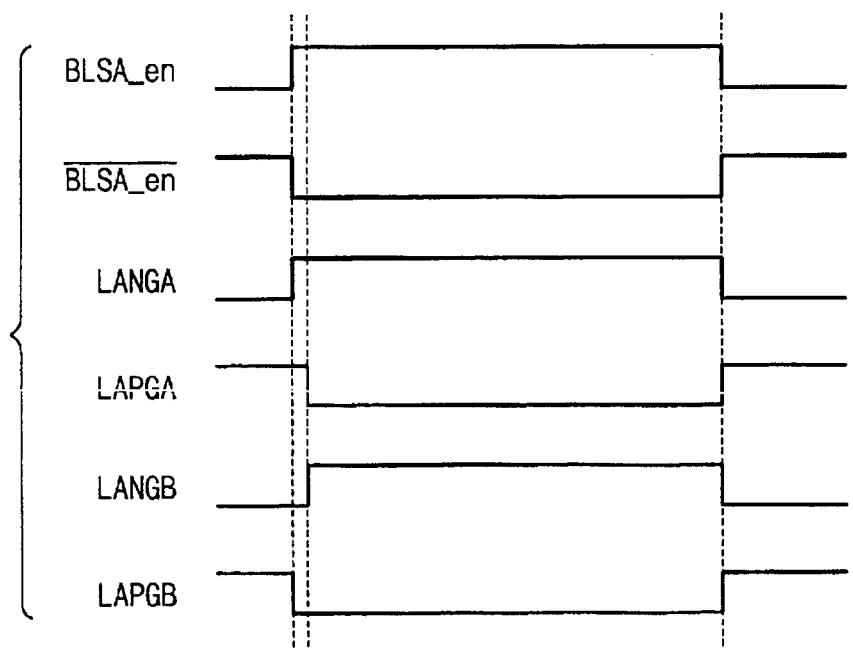
FIG. 8 is a diagram illustrating waveforms of control signals output from the control block of FIG. 7, according to an embodiment of the present invention.

FIG. 7 is a circuit diagram of the control blocks 140A and 140B, according to an embodiment of the present invention. The control block 140A, which comprises an inverter INV10, a delay element 142, and NAND gate G10, generates the control signals LANGA and LAPGA for the sense amplifier block 120A in response to a complementary sense enable signal $\overline{BLSA\_en}$. When the complementary sense enable signal $\overline{BLSA\_en}$ transitions from a high level to a low level, as illustrated in FIG. 8, the control signal LANGA is activated at a high level, thereby, activating an NMOS transistor M22 of the sense amplifier block 120A. As a consequence, ground voltage is supplied to a voltage line Lab through the NMOS transistor M22. The control signal LANGA is delayed by the delay element 142. The delayed and non-delayed control signals LANGA are NAND gated by the gate G10 to generate the control signal LAPGA. The control signal LAPGA transitions from a high level to a low level, in response to the transition of the signal $\overline{BLSA\_en}$. In response to the transition of the control signal LAPGA, a PMOS transistor M21 of the sense amplifier block 120A is turned on, so that power supply voltage for array Varray is supplied to a voltage line LA through the PMOS transistor M21.

The control block 140B, which comprises an inverter INV12, a delay element 144 and NOR gate G12, generates the control signals LANGB and LAPGB for the sense amplifier block 120B in response to a sense enable signal BLSA_en. When the sense enable signal BLSA_en transitions from a low level to a high level, as illustrated in FIG. 8, the control signal LAPGB is activated at a low level. In response to the activation of the control signal LAPGB, a PMOS transistor M11 of the sense amplifier block 120B in FIG. 6 is turned on, so that the power supply voltage for array Varray is supplied to the voltage line LA through the PMOS transistor M11. The control signal LAPGB is delayed by the delay element 144. The delayed and non-delayed control signals LAPGB are NOR gated by the gate G12 to generate the control signal LANGB. The control signal LANGB transitions to a high level from a low level, thereby activating an NMOS transistor M10 of the sense amplifier block 120B in FIG. 6. As a consequence, the ground voltage is supplied to the voltage line LAb through the NMOS transistor M10.

In a preferred embodiment of the present invention, the control signal LANGA for the sense amplifier block 120A is activated faster than the control signal LANGB for the sense amplifier block 120B, and the control signal LAPGA for the sense amplifier block 120A is activated slower than the control signal LAPGB for the sense amplifier block 120B. Thus, when the voltages of adjacent bit lines in different columns transition in an opposite direction from each other, the voltages of the adjacent bit lines are amplified at the same time.

Figure 9:
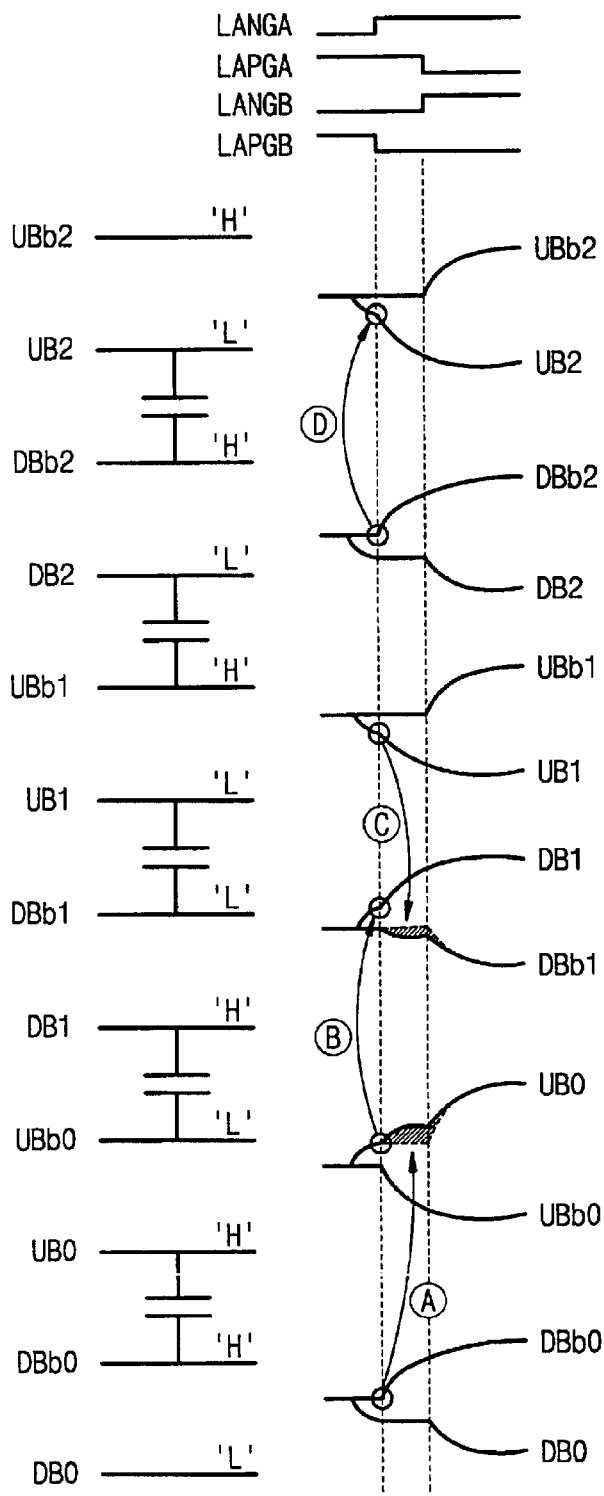
FIG. 9 is a diagram illustrating coupling noise caused in sensing a memory cell corresponding to a column, according to an embodiment of the present invention.

FIG. 9 is a diagram illustrating the coupling noise caused in response to sensing a memory cell corresponding to a column, according to an embodiment of the present invention. Assume that data '0' is stored in memory cells connected to the true bit lines DB0, UB1, DB2 and UB2 of first, fourth, fifth and sixth columns and data '1' is stored in memory cells connected to true bit lines UB0 and DB1 of second and third columns. Under these conditions, when the memory cells are sensed, a positive coupling effect is obtained between the bit lines UB0 and DBb0 and between the bit lines UB1 and DBb1, and no coupling effect is obtained between the bit lines DB1 and UBb0 and between the bit lines UB2 and DBb2. In FIG. 9, arrows "A" and "C" respectively indicate the positive coupling effect, and arrows "B" and "D" respectively indicate that no coupling effect is generated.

When the data '0' is stored in the memory cell connected to the true bit line DB0 of the first column, the precharged voltage of the true bit line DB0 is lowered by the voltage corresponding to the data '0' and the complement bit line DBb0 maintains the precharged voltage. When the data '1' is stored in the memory cell connected to the true bit line UB0 of the second column, the precharged voltage of the true bit line UB0 is increased by the voltage corresponding to the data '1' and the complement bit line UBb0 maintains the precharged voltage.

When the control signal LAPGB for the sense amplifier block 120B transitions from a low level to a high level, the voltage of the complement bit line DBb0 of the first column is amplified to the power supply voltage for array Varray. The voltage of the complement bit line DBb0 has a relatively higher voltage than the voltage of the true bit line DB0. The voltage of the true bit line UB0 of the second column (or the bit line of the second column adjacent to the complement bit line of the first column) is increased together with the voltage increasing of the complement bit line DBb0 of the first column, or is coupled with the voltage increasing of the complement bit line DBb0. Thus, the voltage difference between the bit lines UB0 and UBb0 of the second column is increased, which is referred to as "the positive coupling effect (A)". By the positive coupling effect, the voltage of the true bit line UB0 of the second column is amplified to the power supply voltage for array, in response to the high-to-low transition of the control signal LAPGA for the sense amplifier block 120A.

As illustrated in FIG. 9, the voltage of the true bit line DB0 of the first column becomes the ground voltage in response to the low-to-high transition of the control signal LANGB for the sense amplifier block 120B. The voltage of the complement bit line UBb0 of the second column becomes the ground voltage in response to the low-to-high transition of the control signal LANGA for the sense amplifier block 120A.

When the data '1' is stored in the memory cell connected to the true bit line DB1 of the third column, the precharged voltage of the true bit line DB1 is increased by the voltage corresponding to the data '1'. The complement bit line DBb1 thereof maintains the precharged voltage. When the data '0' data is stored in the memory cell connected to the true bit line UB1 of the fourth column, the precharged voltage of the true bit line UB1 is lowered by the voltage corresponding to the data '0'. The complement bit line UBb1 maintains the precharged voltage.

If the control signal LANGA transitions from a low level to a high level, the voltage of the true bit line UB1 of the fourth column is lowered to the ground voltage. The true bit line UB1 has a relatively lower voltage than the voltage of the complement bit line UBb1. The voltage of the complement bit line DBb1 of the third column (or the bit line of the third column adjacent to the true bit line of the fourth column) is lowered together with the voltage decreasing of the true bit line UB1 of the fourth column. Thus, the voltage difference between the bit lines DB1 and DBb1 of the third column is increased, thereby generating the positive coupling effect "C". By the positive coupling effect, the voltage of the complement bit line DBb1 of the third column becomes the ground voltage in response to the low-to-high transition of the control signal LANGB for the sense amplifier block 120B.

In a preferred embodiment of the present invention, when the voltages of the adjacent bit lines UBb0 and DB0 among the bit lines DB0, DBb0, UB0, and UBb0 of the first and second columns transition in the same direction (e.g., in the power supply voltage direction), the positive coupling effect "A" (shown in FIG. 9) is generated. Similarly, the voltages of the adjacent bit lines UB1 and DBb1 among the bit lines DB1, DBb1, UB1, and UBb1 of the third and fourth columns transition in the same direction (e.g., in the ground voltage direction), the positive coupling effect "C" (shown in FIG. 9) is generated. As a result, coupling noise does not occur between the adjacent bit lines of different columns.

When the data '1' is stored in the memory cell connected to the true bit line UB0 of the second column, the precharged voltage of the true bit line UB0 is increased by the voltage corresponding to the data '1'. The complement bit line UBb0 of the second column maintains the precharged voltage. When the data '1' is stored in the memory cell connected to the true bit line DB1 of the third column, the precharged voltage of the true bit line DB1 of the third column is increased by the voltage corresponding to the data '1'. The complement bit line DBb1 of the third column maintains the precharged voltage.

When the control signal LANGA transition from a low level to a high level, the voltage (a relatively lower voltage) of the complement bit line UBb0 is amplified to the ground voltage. At the same time, when the control signal LAPGB transitions from a high level to a low level, the voltage (a relatively higher voltage) of the true bit line DB1 is amplified to the power supply voltage for array. Thus, when the adjacent bit lines UBb0 and DB1 among the bit lines UB0, UBb0, DB1, and DBb1 of the second and third columns transition in the opposite direction from each other, the voltages of the adjacent bit lines UBb0 and DB1 are amplified at the same time, as indicated by "B" in FIG. 9. This means that the coupling noise does not occur between the adjacent bit lines UBb0 and DB1.

When the data '0' is stored in the memory cell connected to the true bit line DB2 of the fifth column, the precharged voltage of the true bit line DB2 is lowered by the voltage corresponding to the data '0' and the complement bit line DBb2 maintains the precharged voltage. When the data '0' is stored in the memory cell connected to the true bit line UB2 of the sixth column, the precharged voltage of the true bit line UB2 is lowered by the voltage corresponding to the data '0' and the complement bit line UBb2 maintains the precharged voltage.

When the control signal LANGA for the sense amplifier block 120A transitions from a low level to a high level, the voltage (a relatively lower voltage) of the true bit line UB2 is amplified to the ground voltage. At the same time, when the control signal LAPGB for the sense amplifier block 120B transitions from a high level to a low level, the voltage (a relatively higher voltage) of the complement bit line DBb2 is amplified to the power supply voltage. Thus, when the adjacent bit lines UB2 and DBb2 among the bit lines UB2, UBb2, DB2, and DBb2 of the fifth and sixth columns transition in the opposite direction from each other, the voltages of the adjacent bit lines UB2 and DBb2 are amplified at the same time, as indicated by "D" in FIG. 9. This means that the adjacent bit lines UB2 and DBb2 do not suffer from coupling noise.

Advantageously, according to preferred embodiments of the present invention, when the voltages of the adjacent bit lines of different columns transition in the opposite direction from each other, coupling noise is prevented between the adjacent bit line by amplifying the voltages of the adjacent bit lines at the same time.

Although the invention has been described using exemplary preferred embodiments, it is to be understood that the scope of the invention is not limited to the disclosed embodiments. On the contrary, the invention is intended to cover various modifications and similar arrangements. The scope of the claims, therefore, should be accorded the broadest interpretation so as to encompass all such modifications and similar arrangements.

What is claimed is:

1. A semiconductor memory device, comprising:
   first and second columns, wherein each column comprises a pair of bit lines, and wherein the first and second columns are adjacent;
   a first sense amplifier, connected to the bit lines of the first column, for sensing and amplifying a voltage difference between the bit lines of the first column;
   a second sense amplifier, connected to the bit lines of the second column, for sensing and amplifying a voltage difference between the bit lines of the second column; and
   a control circuit for controlling the first and second sense amplifiers, wherein when voltage levels of adjacent bit lines of the first and second columns transition in an opposite direction during a read operation, the control circuit controls the first and second sense amplifiers to concurrently amplify the voltages of the adjacent bit lines.

2. The device of claim 1, wherein when the voltage levels of the adjacent bit lines of the first and second columns transition in the same direction during the read operation, the control circuit controls the first and second sense amplifiers to amplify the voltages of the adjacent bit lines at different times within a predetermined interval.

3. The device of claim 2, wherein the control circuit generates first and second control signals for each of the first and second sense amplifiers in response to one of a sense enable signal and a complementary sense enable signal.

4. The device of claim 3, wherein the first and second control signals for each of the first and second sense amplifiers are sequentially activated within the predetermined time interval.

5. The device of claim 3, wherein the first control signal for the first sense amplifier is activated concurrently with the second control signal for the second sense amplifier, and wherein the second control signal for the first sense amplifier is activated concurrently with the first control signal for the second sense amplifier.

6. The device of claim 3, wherein the control circuit comprises:
   a first inverter for inverting the complementary sense enable signal to output the first control signal for the first sense amplifier;
   a first delay element for delaying the first control signal for the first sense amplifier;
   a first combining device for combining the delayed first control signal for the first sense amplifier and the first control signal for the first sense amplifier to output the second control signal for the first sense amplifier;
   a second inverter for inverting the sense enable signal to output the second control signal for the second sense amplifier;
   a second delay element for delaying the second control signal for the second sense amplifier; and
   a second combining device for combining the delayed second control signal for the second sense amplifier and the second control signal for the second sense amplifier to output the first control signal for the second sense amplifier.

7. The device of claim 3, wherein each of the first and second sense amplifiers comprises:
   a pull-up circuit for pulling up a first voltage line in response to the first control signal for the first or second sense amplifier;
   a pull-down circuit for pulling down a second voltage line in response to the second control signal for the first or second sense amplifier; and
   a sense amplifier, connected to the first and second voltage lines and to the bit lines of the first or second column, for sensing and amplifying the voltage difference between the bit lines of the first or second column.

8. The device of claim 7, wherein the sense amplifier comprises a latch-type sense amplifier.

9. A semiconductor memory device, comprising:
   an array of memory blocks each comprising a plurality of columns, each column comprising a pair of bit lines;
   a plurality of sense amplifier blocks, wherein first and second sense amplifier blocks are disposed on opposite sides of a corresponding memory block, wherein each sense amplifier block comprises a plurality of sense amplifiers connected to columns of the corresponding memory block, wherein adjacent columns are connected to sense amplifiers on opposite sides of the memory block; and
   a control circuit for controlling the first and second sense amplifier blocks, wherein when voltage levels of adjacent bit lines of adjacent columns of a memory block transition in an opposite direction during a read operation, the control circuit controls the first and second sense amplifier blocks to concurrently amplify the voltages of the adjacent bit lines.

10. The device of claim 9, wherein when the voltage levels of adjacent bit lines of adjacent columns transition in the same direction during the read operation, the control circuit controls the first and second sense amplifier blocks to amplify the voltages of the adjacent bit lines at different times within a predetermined time interval.

11. The device of claim 10, wherein the control circuit generates first and second control signals for each of the first and second sense amplifier blocks in response to one of a sense enable signal and a complementary sense enable signal, and wherein the first and second control signals for each of the first and second sense amplifier blocks are sequentially activated within the predetermined time interval.

12. The device of claim 10, wherein the first control signal for the first sense amplifier block is activated concurrently with the second control signal for the second sense amplifier block, and wherein the second control signal for the first sense amplifier block is activated concurrently with the first control signal for the second sense amplifier block.

13. The device of claim 10, wherein each of the first and second sense amplifier blocks comprise:
   a pull-up circuit for pulling up a first voltage line in response to the first control signal for the first or second sense amplifier block;

a pull-down circuit for pulling down a second voltage line in response to the second control signal for the first or second sense amplifier block; and a latch-type sense amplifier, connected to the first and second voltage lines and to the bit lines of a corresponding column, for sensing and amplifying a voltage difference between the bit lines of the column.

14. A method for preventing coupling noise from being generated in a semiconductor memory device, the device comprising first and second columns each comprising a pair of bit lines, comprising the steps of:

sensing voltage differences between the bit lines in the first and second columns, respectively; and concurrently amplifying voltage of adjacent bit lines of the first and second columns, when the voltage levels of the adjacent bit lines of the first and second columns transition in an opposite direction during a read operation.

15. The method of claim 14, further comprising the step of amplifying the voltages of the adjacent bit lines of the first and second columns at different times within a predetermined time interval, when the voltage levels of the adjacent bit lines of the first and second columns transition in the same direction during the read operation.

16. The method of claim 14, further comprising the step of generating first and second control signals for each of the first and second columns in response to one of a sense enable signal and a complementary sense enable signal to control the amplification of the voltages of the adjacent bit lines of the first and second columns.

17. The method of claim 16, wherein the step of generating the first and second control signals comprises the steps of:

inverting the complementary sense enable signal to output the first control signal for the first column;

delaying the first control signal for the first column;

combining the delayed first control signal for the first column and the first control signal for the first column to output the second control signal for the first column;

inverting the sense enable signal to output the second control signal for the second column;

delaying the second control signal for the second column; and combining the delayed second control signal for the second column and the second control signal for the second column to output the first control signal for the second column.

18. The method of claim 17, wherein the first and second control signals for each of the first and second columns are sequentially activated within the predetermined time interval.

19. The method of claim 17, wherein the first control signal for the first column is activated concurrently with the second control signal for the second column, and wherein the second control signal for the first column is activated concurrently with the first control signal for the second column.

* * * * *